United States Patent [19]

Bruni

[11] 4,302,280

[45] Nov. 24, 1981

[54] GROWING GADOLINIUM GALLIUM GARNET WITH CALCIUM IONS

[75] Inventor: Frank J. Bruni, Charlotte, N.C.

[73] Assignee: Texas Instruments Incorporated, Dallas, Tex.

[21] Appl. No.: 106,321

[22] Filed: Dec. 21, 1979

Related U.S. Application Data

[63] Continuation of Ser. No. 960,536, Nov. 14, 1978, abandoned.

[51] Int. Cl.³ .......................................... C30B 15/00
[52] U.S. Cl. ..................... 156/617 SP; 156/DIG. 63
[58] Field of Search ......... 156/617 SP, 624, DIG. 63; 423/263; 23/301; 422/249; 148/172

[56] References Cited

U.S. PATENT DOCUMENTS 3,723,599  3/1973  Brandlere et al. ................. 423/263
3,951,729  4/1976  Takagi et al. .................. 156/617 SP

OTHER PUBLICATIONS

Crystal Growth After Heater–(Iszele IBH), Technical Disclosure Bulletin V17N6, 7/74, p. 426.
Crystals Springer–Verlag, N.Y., 1978, pp. 55, 56, 69.

Primary Examiner—Hiram Bernstein
Attorney, Agent, or Firm—Gary C. Honeycutt; Richard Donaldson; Mel Sharp

[57] ABSTRACT

Monocrystalline gadolinium gallium garnet is prepared by the Czochralski growth process from a melt composed of the oxides of gadolinium and gallium. In order for this process to produce uniform crystal growth, the growing crystal must support a meniscus of liquid above the level of the surrounding melt. This meniscus is held up by the surface tension between the liquid and the growing crystal. It has been established that impurities in the meniscus region lower the surface tension of the liquid phase causing the meniscus to lose contact with the solid phase resulting in nonuniform crystal growth. By the addition of approximately 100 ppm of calcium into the melt, a counteracting effect is produced causing the meniscus to remain in contact with the growing crystal.

4 Claims, 2 Drawing Figures

GROWING GADOLINIUM GALLIUM GARNET WITH CALCIUM IONS

This is a continuation, of application Ser. No. 960,536, filed Nov. 14, 1978 now abandoned.

BACKGROUND OF THE INVENTION

The present invention relates in general to a method for growing a monocrystalline gadolinium gallium compound, and more particularly, to a method of maintaining an adherent meniscus between the melt and growing crystal in the process of growing monocrystalline gadolinium gallium garnet.

Semiconductor devices, such as bubble memories, commonly employ crystals of various chemical elements and compounds, wherein gadolinium and gallium compounds are particularly important for use in such devices. It has been found that in order to obtain gadolinium and gallium containing devices having reproducible properties, satisfactory reliability and reasonably satisfactory electrical characteristics, the materials used should preferably be of a high degree of purity. It has further been found that for most applications in order to obtain bubble memories of high quality, the gadolinium and gallium compounds should be obtained from a single crystal of material, that is, material with no intercrystalline boundaries present. This is because a single crystal of a substance will contain fewer impurities than multicrystalline materials; with the latter, there is a greater opportunity for unwanted impurities to become lodged between irregularly small crystal grains than to become crystallized as part of a single crystal.

A method used for preparing single crystals is known as Czochralski's technique. In this method, frequently referred to as the crystal-pulling technique, a seed crystal is dipped into a molten mass of material, and the surface of solidification of the crystal is gradually advanced for the seed crystal to the molten substance. It is apparent that in growing single crystals using such a method, lowering the crucible with the seed affixed is equivalent to raising the seed holder with the crucible maintained in place.

Where the crystal-pulling technique has been used for the growing of monocrystalline gadolinium gallium garnet, it has been found that obtaining uniform crystal growth is adventurous and haphazard. In order for the Czochralski technique to work successfully, the growing crystal must support a column of liquid (meniscus) above the level of the surrounding melt. This meniscus column is held up by the surface tension between the liquid and the growing crystal. It is a well-established phenomenon of physical chemistry that impurities lower the surface tension of liquids. It has been observed frequently in the growth of monocrystalline gadolinium gallium garnet that the meniscus will drop off the crystal due to a low surface tension. When this occurs, crystal growth is effectively prohibited since the essential adhesion between the growing crystal and liquid phase cannot be maintained.

It is therefore an object of the present invention to provide a method for the growth of monocrystalline gadolinium/gallium compounds having effective uniform crystal growth.

It is yet a further object of the present invention to provide a method of maintaining an adherent meniscus between the liquid phase and growing crystal in the process of growing a monocrystalline gadolinium/gallium compound.

It is still a further object of the present invention to provide an improved method for the growth of monocrystalline gadolinium gallium garnet for use in bubble memory applications.

It is yet still a further object of the present invention to provide a chemical method for counteracting the effect of impurities in gadolinium sesquioxide during the crystal growth of gadolinium gallium garnet.

SUMMARY OF THE INVENTION

A method of growing a monocrystalline gadolinium/gallium compound such as gadolinium gallium garnet is described. A melt composition is provided comprising a mixture of gadolinium sesquioxide and gallium sesquioxide that also contains about 5 ppm to 10,000 ppm calcium, based on gadolinium sesquioxide. A seed crystal is contacted with the melt composition and is progressively separated from the melt whereby an adherent meniscus of the melt composition uniformly contacts the monocrystalline compound. As a result, monocrystalline gadolinium gallium garnet is grown from the adherent meniscus of material. The calcium additive is preferably selected from the group consisting of elemental calcium, calcium oxide, and calcium carbonate.

BRIEF DESCRIPTION OF THE DRAWINGS

The invention, together with its various features and advantages, can be easily understood from the following, more detailed description, taken in conjunction with the accompanying drawings in which.

DETAILED DESCRIPTION

Monocrystalline gadolinium gallium garnet is prepared by the Czochralski growth process from a melt composed of the oxides of gadolinium and gallium. In order for this process to produce uniform crystal growth, the growing crystal must support a meniscus of the liquid above the level of the surrounding melt. This meniscus is held up by the surface tension between the liquid and the growing crystal. Monocrystalline gadolinium gallium garnet has wide application for use in bubble memories.

Figure 1:
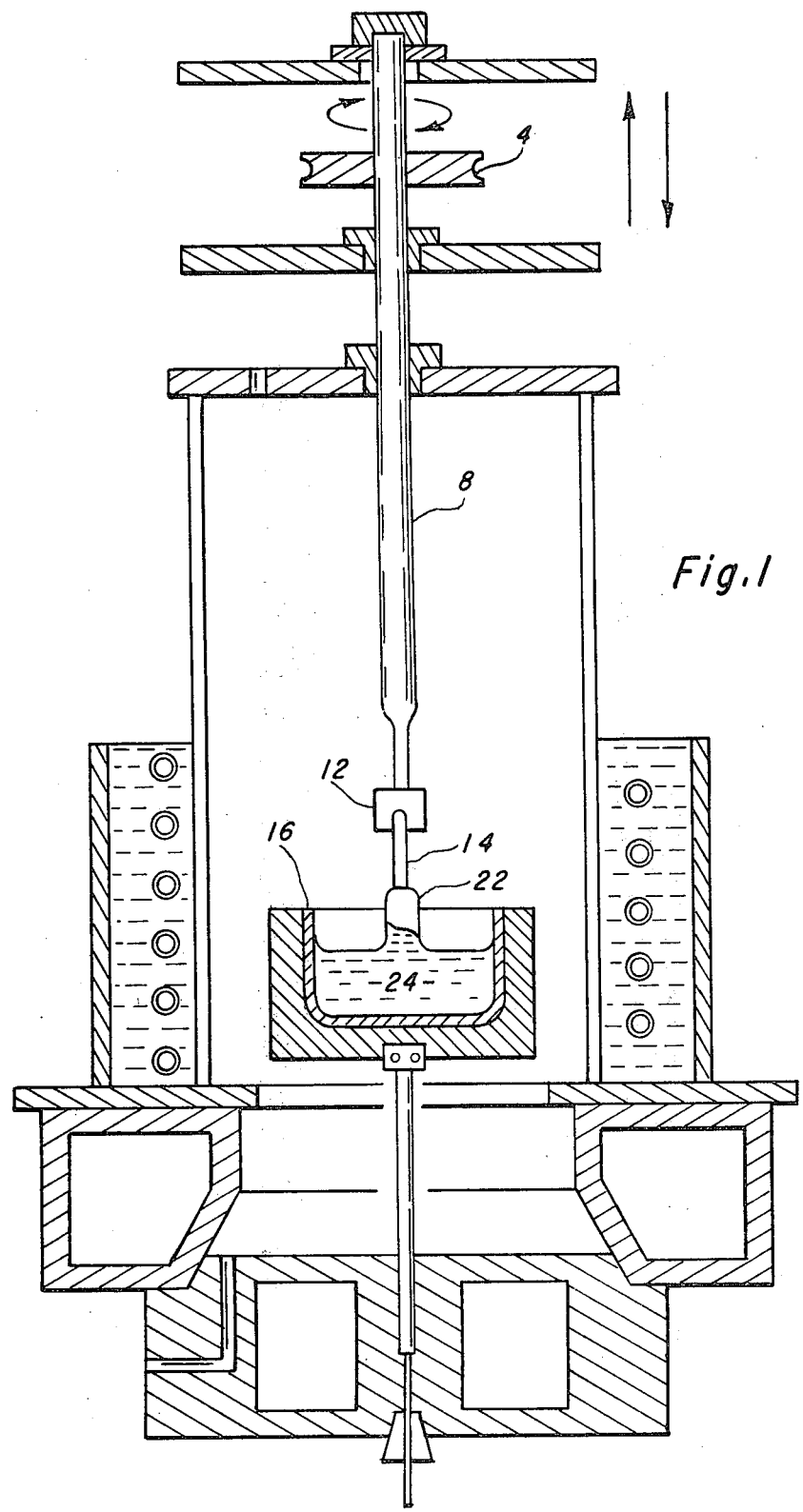
FIG. 1 is a cross-sectional front view of the apparatus used in the Czochralski growth process employed by the present invention.

Referring now to FIG. 1, a suitable apparatus is illustrated for preparing monocrystalline gadolinium gallium garnet in accordance with the principles of this invention. In the embodiment, gadolinium gallium garnet is grown from a melt comprising about three parts gadolinium sesquioxide, about five parts gallium sesquioxide, and 100 ppm calcium carbonate. The melt composition used to grow the single crystal or monocrystalline compound is placed in a suitable container 16 made of a material which is substantially inert to the molten compound. Refractory metals such as iridium and the like which do not react substantially are considered suitable. The molten composition in the crucible is maintained at a constant temperature slightly above its melting point.

To start crystal growth, a seed crystal 14 of pure single crystal gadolinium gallium garnet is used. This seed is attached to a crystal holder 12 and is lowered to contact the surface of the small pool of molten composition 24 contained in the crucible 16; and a crystal is grown therefrom. During the process of crystal growth, the crystal holder 8 is rotated by a mechanical arrangement and by the pulley 4.

In the Czochralski crystal-pulling technique, the seed making contact with the molten composition is gradually withdrawn at a uniform rate allowing the molten composition to crystallize onto the growing seed. The meniscus region located just above the molten composition is maintained at a temperature slightly below the melting temperature of the growing crystal.

Figure 2A:
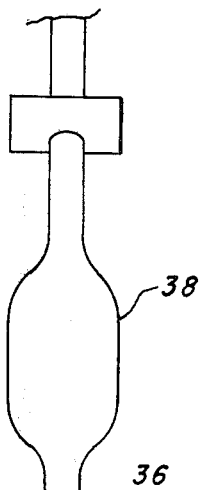
FIG. 2a is a pictorial view of a monocrystalline growth process without the addition of calcium.
Figure 2A:
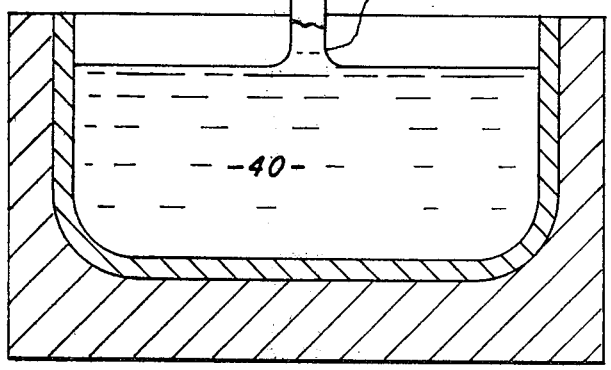

Referring now to FIG. 2a, the result of a low surface tension in the growth of gadolinium gallium garnet is observed. A melt composition 40 of gadolinium sesquioxide and gallium sesquioxide is provided in the crucible. Due to the impurity buildup in the meniscus region 36, as the growing monocrystal 38 is withdrawn from the molten composition 40, the meniscus loses its adherence to the growing crystal resulting in nonuniform crystal growth. This is indicated in FIG. 2a by the narrowing down of the diameter of the crystal.

This problem is widespread in the garnet industry. Although it has not been documented in the literature, it has been frequently described and discussed among members of the crystal-growing community and suppliers of gadolinium oxide.

Chemical analysis of various lots of gadolinium oxide for common metal impurities reveals that lots high in calcium impurities consistently yielded superior results in gadolinium gallium garnet crystal growth. When calcium is added to other lots of gadolinium oxide that had previously failed to produce uniform crystals, the problem of low surface tension was eliminated and good meniscus adhesion followed.

Calcium concentrations in the range of about 5 ppm to about 100 ppm have been employed based on a gadolinium sesquioxide. The calcium added has been selected from a group comprising elemental calcium, calcium oxide, and calcium carbonate. These weight percentages and calcium compounds are by way of example only. Other percentages and compounds may be used without departing from the scope of the present invention.

Figure 2B:
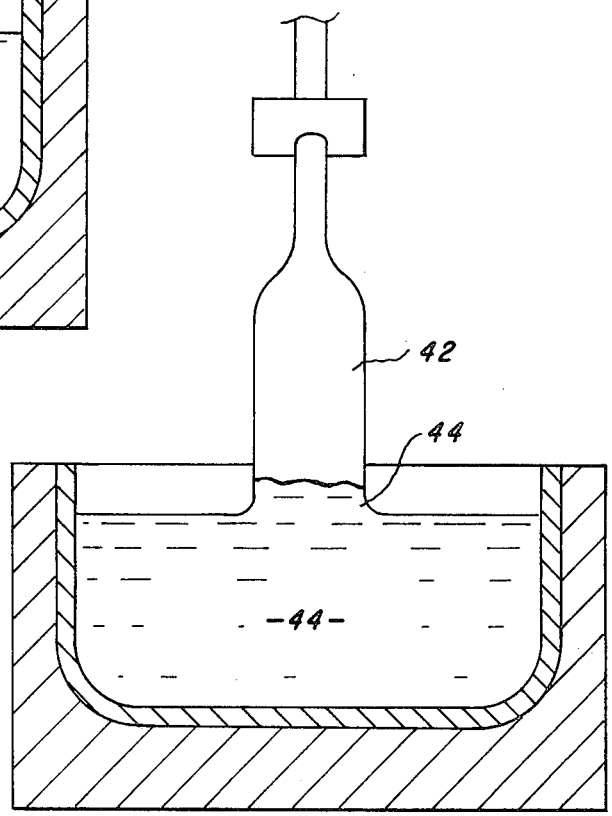
FIG. 2b is a pictorial view of a monocrystalline growth process using calcium addition according to the method of the present invention.

FIG. 2b indicates the monocrystalline growth of gadolinium gallium garnet by the method of the present invention. A melt composition 46 comprising approximately three parts gadolinium sesquioxide, about five parts gallium sesquioxide, and about 5 ppm to 100 ppm of calcium carbonate based on gadolinium sesquioxide content is employed. A seed crystal is attached to a seed chuck and lowered to make contact with the melt composition. As the seed crystal is withdrawn from the melt composition, a monocrystalline gadolinium gallium garnet 42 is grown that supports the meniscus 44. The meniscus 44 is uniformly adhered to the seed crystal producing a crystalline growth of uniform diameter.

While not being restricted to the explanation proposed, it can be reasonably assumed that the divalent calcium ions are charge compensating a tetravalent impurity in the gadolinium oxide. By so doing, the tetravalent impurity will more readily be incorporated into the crystal. If this does not occur, the tetravalent impurity will be rejected from the growing crystal and will accumulate in the meniscus region ahead of the growing crystal. This accumulation will increase the effect of the impurity by increasing its local concentration. The addition of calcium to the melt is thus a method of counteracting the effect of impurities in gadolinium sesquioxide.

From the invention that has been described with respect to a specific preferred embodiment thereof, many variations and modifications thereof will immediately become apparent to those skilled in the art. It is therefore the intention that the appended claims be interpreted as broadly as possible in view of the prior art to include all such variations and modifications.

What is claimed is:

1. A method of growing monocrystalline gadolinium gallium garnet comprising the steps of:

providing a melt composition comprising gallium sesquioxide, gadolinium sesquioxide, and 100 to 10,000 ppm of calcium ions sufficient to maintain an adherent meniscus between said melt and said growing garnet, contacting said melt with a seed crystal, progressively separating said seed crystal from said melt maintaining an adherent meniscus of said melt in contact with said growing monocrystalline garnet, and growing said monocrystalline garnet from said adherent meniscus.

2. A method as set forth in claim 1 wherein said melt compound comprises about three parts gadolinium sesquioxide ($Gd_2O_3$) and about five parts gallium sesquioxide ($Ga_2O_3$).

3. A method as set forth in claim 1 wherein said calcium is selected from a group comprising calcium oxide and calcium carbonate.

4. A method as set forth in claim 1 wherein said seed crystal comprises monocrystalline gadolinium gallium garnet ($Gd_2Ga_3O_{12}$).

* * * * *